United States Patent
Lee et al.

(10) Patent No.: US 7,348,241 B2
(45) Date of Patent: Mar. 25, 2008

(54) CELL STRUCTURE OF EPROM DEVICE AND METHOD FOR FABRICATING THE SAME

(75) Inventors: Joon-hyung Lee, Seongnam (KR); Byung-sun Kim, Suwon (KR); Tae-jung Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 36 days.

(21) Appl. No.: 11/384,727

(22) Filed: Mar. 20, 2006

(65) Prior Publication Data

US 2006/0160293 A1   Jul. 20, 2006

Related U.S. Application Data

(62) Division of application No. 10/702,350, filed on Nov. 6, 2003, now Pat. No. 7,053,443.

(30) Foreign Application Priority Data

Jan. 11, 2003 (KR) ................. 2003-1814

(51) Int. Cl.
*H01L 21/336* (2006.01)
(52) U.S. Cl. ............ 438/264; 438/201; 438/257; 438/263; 438/279; 257/680; 257/681; 257/E21.68; 257/E21.209
(58) Field of Classification Search ........... 438/201, 438/257, 263, 264; 257/681
See application file for complete search history.

(56) References Cited

U.S. PATENT DOCUMENTS 4,794,565 A    12/1988  Wu et al. ............... 365/185
5,838,039 A *  11/1998  Sato et al. .............. 257/321
6,327,187 B1   12/2001  Bergemont et al. .... 365/185.28
6,774,431 B2   8/2004   Rudeck ................. 257/316
6,849,506 B2 *  2/2005  Na et al. ................ 438/264

FOREIGN PATENT DOCUMENTS

JP       11-111866       4/1999

* cited by examiner

*Primary Examiner*—Dao H. Nguyen
(74) *Attorney, Agent, or Firm*—Mills & Onello LLP

(57) ABSTRACT

Provided are a cell structure of an EPROM device and a method for fabricating the same. The cell structure includes a gate stack, which includes a first floating gate, an insulating pattern including a nitride layer, and a control gate that are sequentially stacked on a semiconductor substrate, and includes a window for exposing the top surface or both sidewalls of the first floating gate on both sides of the control gate, so that charges of the first floating gate can be erased by ultraviolet rays. The cell structure further includes a floating gate transistor, which includes a gate insulating layer formed on the semiconductor substrate, a second floating gate that is formed on the gate insulating layer and is connected to the first floating gate in the gate stack, and a source/drain region that is formed in the semiconductor substrate so as to be aligned to the second floating gate. In the cell structure, the window is formed on the top surface or both sidewalls of the first floating gate of the gate stack. Thus, ultraviolet rays can penetrate through the window and easily erase charges of the programmed cell.

8 Claims, 12 Drawing Sheets

CELL STRUCTURE OF EPROM DEVICE AND METHOD FOR FABRICATING THE SAME

This application is a divisional of U.S. application Ser. No. 10/702,350 filed Nov. 6, 2003, now Pat. No. 7,053,443 which relies for priority upon Korean Patent Application No. 2003-01814, filed on Jan. 11, 2003, in the Korean Intellectual Property Office, the contents of which are incorporated herein in their entirety by reference.

BACKGROUND OF THE INVENTION

1. Field of the Invention

The present invention relates to a semiconductor memory device and a method for fabricating the same, and more particularly, to a cell structure of an erasable programmable read only memory (EPROM) device and a method for fabricating the same.

2. Description of the Related Art

Semiconductor memory devices can be classified into different types. Among them, there are random access memories (RAMs) and read only memories (ROMs). When the power supply to a memory is interrupted, stored data in the RAM is erased while the ROM maintains stored data. For this reason, memory devices such as ROMs are called "nonvolatile memory devices." EPROM devices, which belong to these nonvolatile memory devices, are reusable by erasing stored data.

Stored data in the EPROM device can be erased by applying ultraviolet rays to a window attached to the surface of a memory chip. Research is being conducted to develop system-on-chip (SOC) devices, in which the EPROM device has been used along with various devices, such as logic circuits or drive circuits, to manufacture these SOC devices. The EPROM device, which can effectively alter fabricated chips, is employed to calibrate minute disparity between products or represent manufacturers' names on the fabricated chips.

In processes of fabricating semiconductors, as the line width of circuits becomes finer, silicide layers, such as TiSix, CoSix, and NiSix, are used to reduce resistances of gate lines and metal contacts. When a silicide layer is used, a nitride layer is used instead of an oxide layer as a gate spacer in order to improve characteristics of a transistor by preventing a short between a gate and a source/drain during a silicidation process.

When a cell of the EPROM device is formed by using the nitride layer as the gate spacer, an ONO (oxide-nitride-oxide) layer is formed on top of a floating gate, and a nitride spacer is formed on the sides thereof. That is, nitride layers are formed all around the floating gate. In this case, since ultraviolet rays cannot penetrate through the nitride layers, it becomes difficult to erase charges of the floating gate by ultraviolet rays. Thus, unlike the case where an oxide layer is used as the floating gate spacer, the EPROM device cannot perform erase operations using ultraviolet rays.

SUMMARY OF THE INVENTION

The present invention provides a cell structure of an EPROM device, by which characteristics of a transistor can be improved using a nitride layer as a floating gate spacer and charges of a floating gate can be erased using ultraviolet rays.

The present invention also provides a method for fabricating the cell structure of the EPROM device.

In accordance with an aspect of the present invention, there are provided cell structures of an EPROM device. According to an embodiment, the cell structure comprises a gate stack, which includes a first floating gate, an insulating pattern formed of a nitride layer, and a control gate that are sequentially stacked on a semiconductor substrate, and includes a window for exposing the top surface or both sidewalls of the first floating gate on both sides of the control gate, so that charges of the first floating gate can be erased by ultraviolet rays. The EPROM device further comprises a floating gate transistor, which includes a gate insulating layer formed on the semiconductor substrate, a second floating gate that is formed on the gate insulating layer and is connected to the first floating gate of the gate stack, and a source/drain that is formed in the semiconductor substrate so as to be aligned to the second floating gate.

Nitride spacers may be further formed on both sidewalls of the control gate, the first floating gate, and the second floating gate. Nitride spacers may be further formed on both sidewalls of the insulating pattern. The control gate, the first floating gate, and the second floating gate may be formed of a doped polysilicon or a metal layer. The insulating pattern of the gate stack may be formed of an ONO layer or an NO (nitride-oxide) layer.

The width of the control gate may be equal to or less than that of the first floating gate. The width of the insulating pattern may be less than that of the first floating gate and more than that of the control gate. The width of the insulating pattern may be equal to that of the first floating gate.

According to another embodiment, the cell structure comprises a gate stack, which includes a first floating gate, an insulating pattern formed of a nitride layer, and a control gate that are sequentially stacked on a semiconductor substrate, and includes a window for exposing the top surface or both sidewalls of the first floating gate on both sides of the control gate, so that charges of the first floating gate can be erased by ultraviolet rays. The cell structure of the EPROM device further comprises a floating gate transistor, which includes a gate insulating layer formed on the semiconductor substrate, a second floating gate that is formed on the gate insulating layer and is connected to the first floating gate of the gate stack, and a source/drain that is formed in the semiconductor substrate so as to be aligned to the second floating gate. With the application of a voltage to the control gate of the gate stack and then to the second floating gate of the floating gate transistor, charges are injected from the source/drain to the first floating gate of the gate stack by hot carrier injection, thus programming the cell. With the application of ultraviolet rays through the window to the gate stack, the charges are discharged from the first floating gate to the source/drain or the semiconductor substrate, thus erasing the programmed cell.

Nitride spacers may be further formed on both sidewalls of the control gate, the first floating gate, and the second floating gate. The width of the control gate may be less than or equal to that of the first floating gate.

In accordance with another aspect of the present invention, there is provided a method of fabricating a cell structure of an EPROM device, comprising defining a gate stack region and a floating gate transistor region on a semiconductor substrate. A first floating gate, an insulating pattern formed of a nitride layer, and a control gate are sequentially formed in the gate stack region. A gate insulating layer, a second floating gate connected to the first floating gate, and an insulating pattern are sequentially stacked in the floating gate transistor region. Impurity ions are implanted into the semiconductor substrate so as to be aligned to both sidewalls of the second floating gate, thereby forming a source/drain. Nitride spacers are formed on both sidewalls of the first floating gate, the control gate, and the second floating gate. The insulating pattern formed on the first floating gate is etched to form a window for exposing the top surface of the first floating gate.

While the window is formed, the insulating pattern can be etched by using the, control gate and the nitride spacers formed on both sidewalls of the control gate as etch masks. While the window is formed, the nitride spacer, and the insulating pattern on the side of the nitride spacer formed on both sidewalls of the control gate may be etched using photolithographic and etching processes. While the window is formed, the nitride spacer, the insulating pattern on the side of the nitride spacer formed on both sidewalls of the control gate, and the first floating gate disposed under the control gate may be etched using photolithographic and etching processes.

The insulating pattern of the gate stack region may be formed of an ONO layer or an NO layer. The control gate may be formed to the width less than or equal to that of the first floating gate. The insulating pattern may be formed to the width less than that of the first floating gate and more than that of the control gate. The insulating pattern may be formed to be the same width as that of the first floating gate.

In the cell of the EPROM device as described above, the window is formed on the surface on both sides of the first floating gate of the gate stack region or on both sidewalls of the first floating gate. Thus, ultraviolet rays can penetrate through the window and easily erase charges of the programmed cell.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
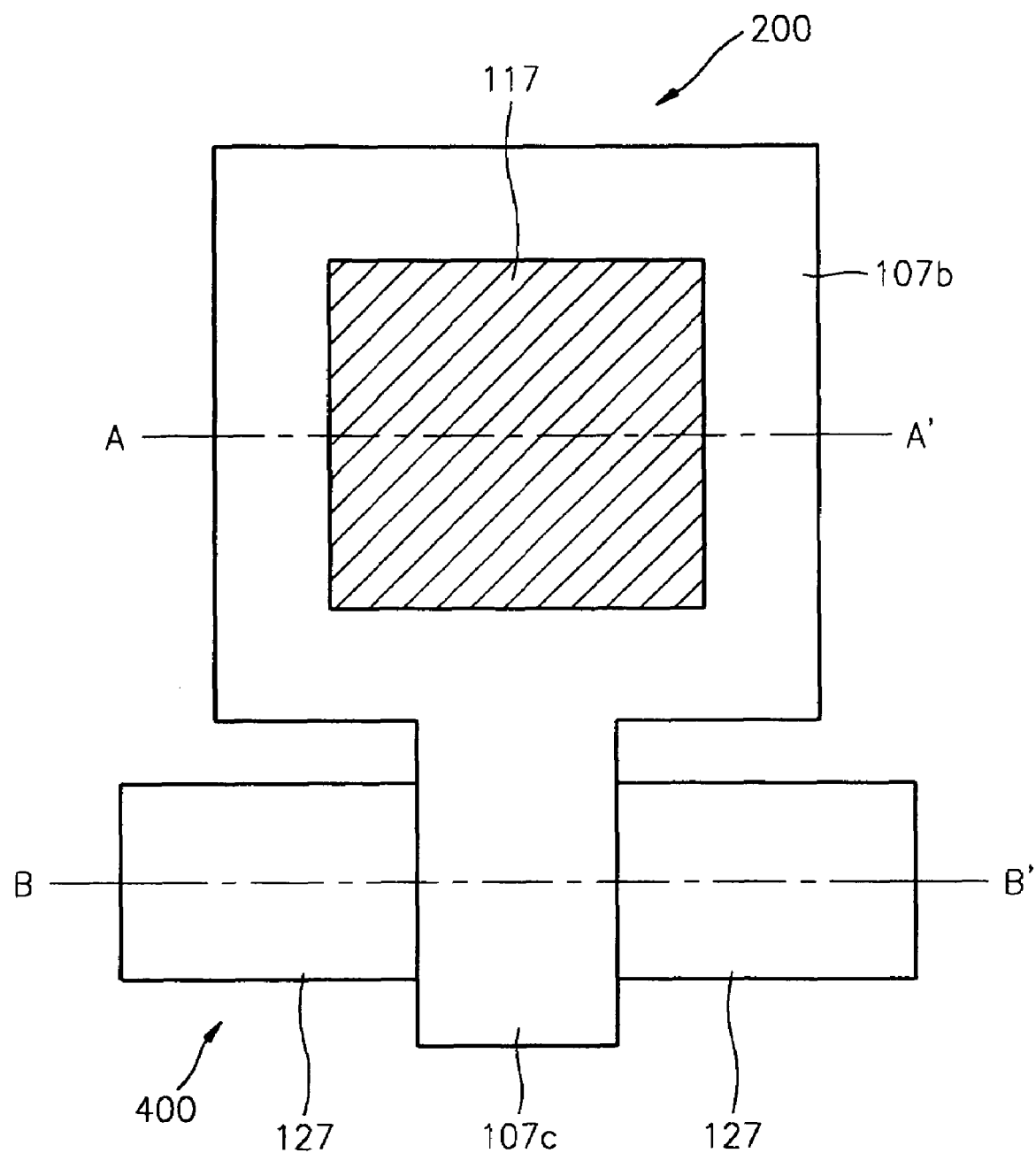
FIGS. 1 and 2 show different embodiments of a cell layout of an EPROM device according to the present invention.

The present invention will now be described more fully with reference to the accompanying drawings, in which preferred embodiments of the invention are shown. In the drawings, the shape of elements is exaggerated for clarity. Further, it will be understood that when a layer is referred to as being "on" another layer or substrate, it can be directly on the other layer or substrate, or intervening layers may also be present.

Figure 2:
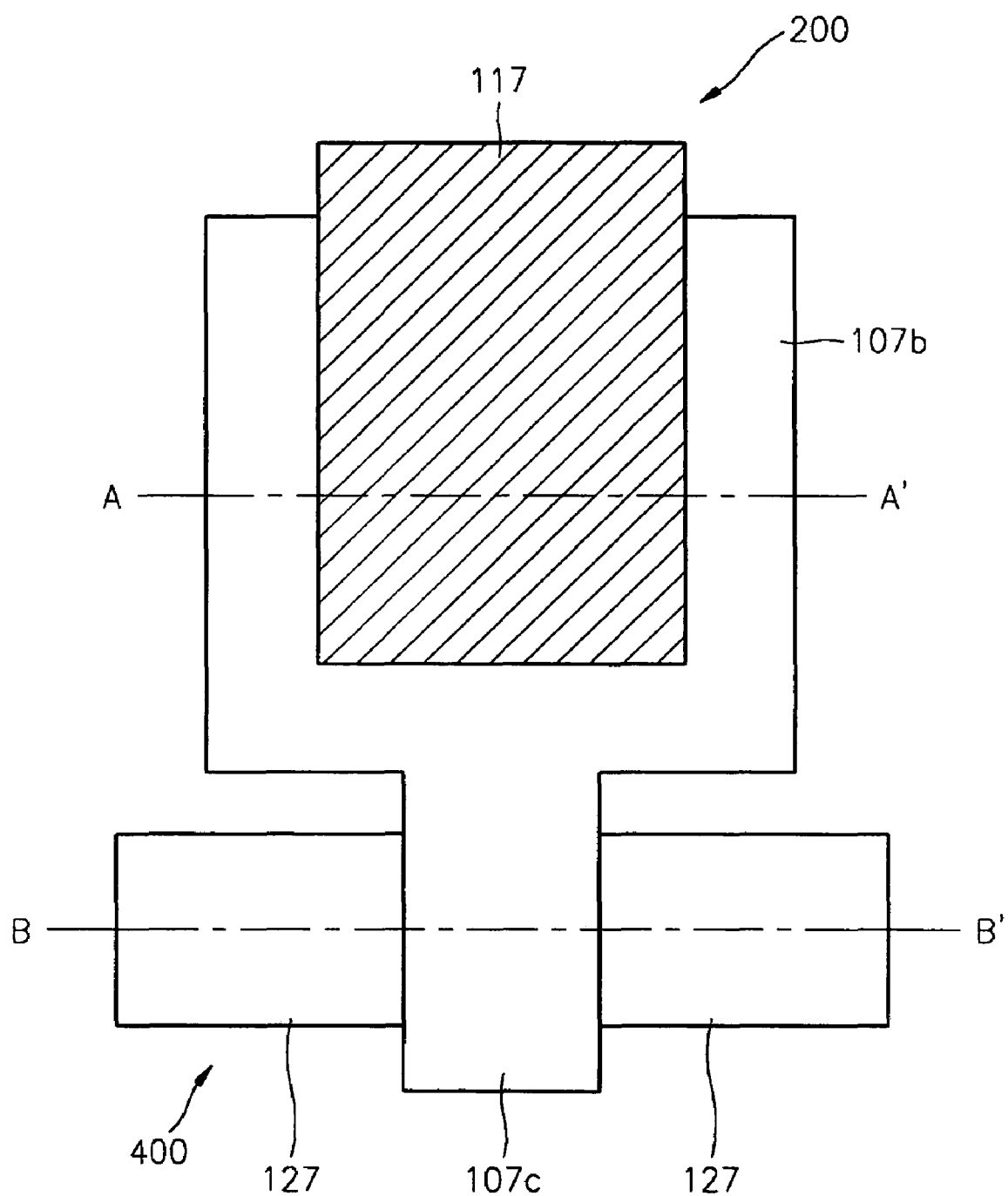

FIGS. 1 and 2 show different embodiments of a cell layout of an EPROM device according to the present invention.

Specifically, the cell of the EPROM according to the present invention comprises a gate stack 200, which includes a first floating gate 107b, an insulating pattern (not shown) including a nitride layer, and a control gate 117 that are sequentially stacked on a semiconductor substrate (not shown). The first floating gate 107b and the control gate 117 are formed of a polysilicon doped with impurity ions or a metal layer such as an aluminium layer. The insulating pattern is formed of an ONO layer or an NO layer.

In FIG. 1, the control gate 117 is formed in the first floating gate 107b of the gate stack 200. In FIG. 2, a portion of the control gate 117 protrudes out of the first floating gate 107b of the gate stack 200. In FIG. 1, although the control gate 117 is formed in the first floating gate 107b, it may overlap with the first floating gate 107b if necessary. The position and the size of the control gate 117 can be variously changed. When the control gate 117 does not overlap with the first floating gate 107b as shown in FIGS. 1 and 2, a window (129 of FIGS. 3 through 5), which is exposed to the outside so as to serve as a path for ultraviolet rays, is formed on the top surface and both sidewalls of the first floating gate 107b.

The cell of the EPROM device further comprises a floating gate transistor 400, which includes a gate insulating layer (not shown) formed on the semiconductor substrate, a second floating gate 107c that is connected to the first floating gate 107b of the gate stack 200, and a source/drain 127 that is formed in the semiconductor substrate on both sides of the second floating gate 107c so as to be aligned to the second floating gate 107c. The second floating gate 107c is connected to the first floating gate 107b and overlaps with the source/drain 127 at right angles. Like the first floating gate 107b, the second floating gate 107c is formed of a polysilicon doped with impurity ions or a metal layer such as an aluminium layer.

When a voltage is applied to the control gate 117 of the gate stack and then applied to the second floating gate 107c, charges are injected from the source/drain 127 into the first floating gate 107b by hot carrier injection, thus programming the cell. Then, once ultraviolet rays are applied through the window (129 of FIGS. 3 through 5) to the programmed cell, the charges are discharged from the first floating gate 107b of the gate stack 200 to the source/drain 127, thereby erasing the programmed cell.

Figure 3A:
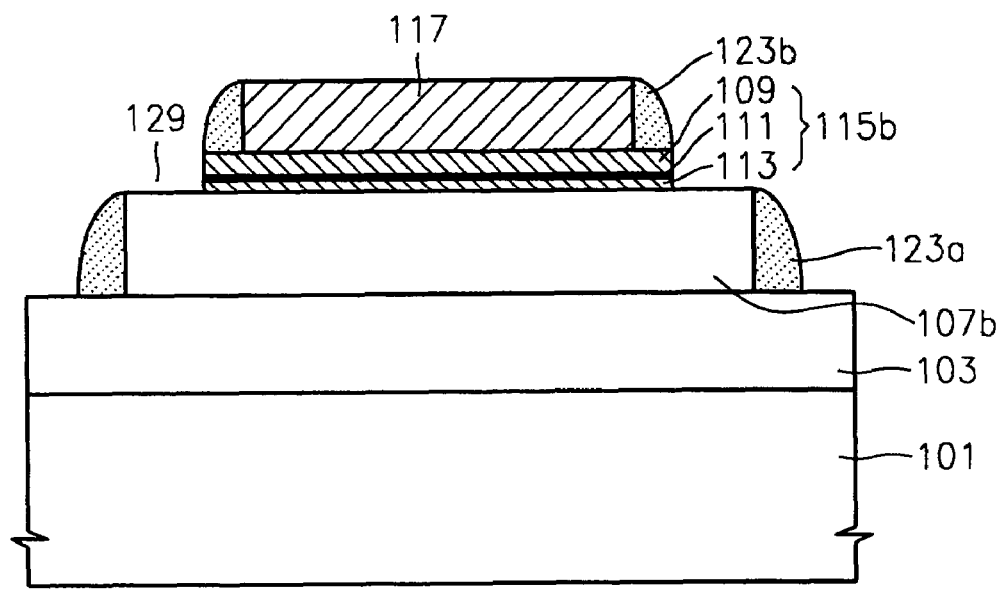
FIGS. 3A and 3B are cross-sectional views taken along the line A-A' of a gate stack and the line B-B' of a floating gate transistor of FIGS. 1 and 2, respectively, according to a first embodiment of the present invention.
Figure 3B:
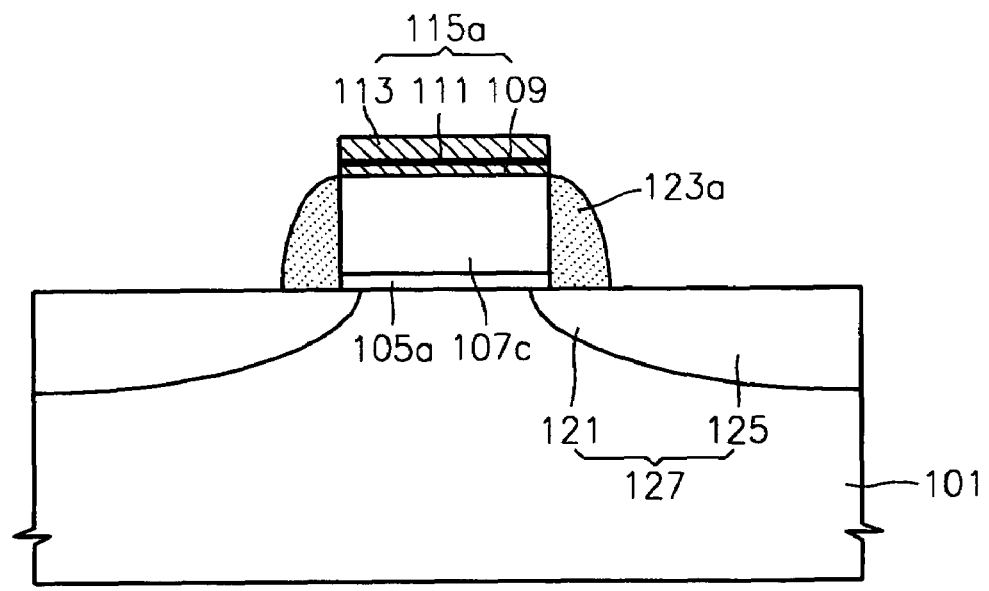

FIGS. 3A and 3B are cross-sectional views taken along the line A-A' of a gate stack and the line B-B' of a floating gate transistor of FIGS. 1 and 2, respectively, according to a first embodiment of the present invention.

Referring to FIG. 3A, the gate stack (200 of FIGS. 1 and 2) is formed by sequentially stacking the first floating gate 107b, an insulating pattern 115b including a nitride layer, and the control gate 117 on a field insulating layer 103 formed on a semiconductor substrate 101. As described above, the first floating gate 107b is formed of a polysilicon doped with impurity ions or a metal layer. The insulating pattern 115b is formed of an oxide layer (O, 109)-nitride layer (N, 111)-oxide layer (O, 113). Here, the insulating pattern 115b may be formed of only the nitride layer 111 and the oxide layer 113. The control gate 117 is formed of a polysilicon doped with impurity ions or a metal layer.

The first floating gate 107b is formed to be a different width from that of the insulating pattern 115b. A first nitride spacer 123a is formed on both sidewalls of the first floating gate 107b. The control gate 117 is formed to have a smaller width than that of the insulating pattern 115b. A second nitride spacer 123b is formed on both sidewalls of the control gate 117 and the top surface of the insulating pattern 115b. Thus, a portion of the top surface of the first floating gate 107b is exposed on both sides of the second nitride spacer 123b so as to form the window 129.

As mentioned above, unlike the conventional cell, in the cell structure of the EPROM device shown in FIG. 3A, a portion of the top surface of the first floating gate 107b is exposed so as to form the window 129. Thus, the programmed cell can be easily erased by applying ultraviolet rays through the window 129 to the cell structure of the EPROM device.

Referring to FIG. 3B, the floating gate transistor (400 of FIGS. 1 and 2) comprises a gate insulating pattern 105a, the second floating gate 107c, and an insulating pattern 115a formed of a nitride layer, which are formed on the semiconductor substrate 101 so as to have the same width. As described above, the insulating pattern 115a is formed of an oxide layer (O, 109)-nitride layer (N, 111)-oxide layer (O, 113). Here, the insulating pattern 115a may be formed of only the nitride layer 111 and the oxide layer 113. The source/drain 127 is formed in the semiconductor substrate 101 so as to be aligned to both sidewalls of the second floating gate 107c. The source/drain includes a lightly doped source/drain 121 and a heavily doped source/drain 125. The first nitride spacer 123a is formed on both sidewalls of the second floating gate 107c.

As described above, in the cell structure of the EPROM device shown in FIG. 3B, the first nitride spacer 123a is formed so as to prevent a short between the second floating gate 107c and the source/drain 127 during the silicidation process for forming the silicide layer (not shown) on the source/drain, thus improving characteristics of the transistor.

Figure 4:
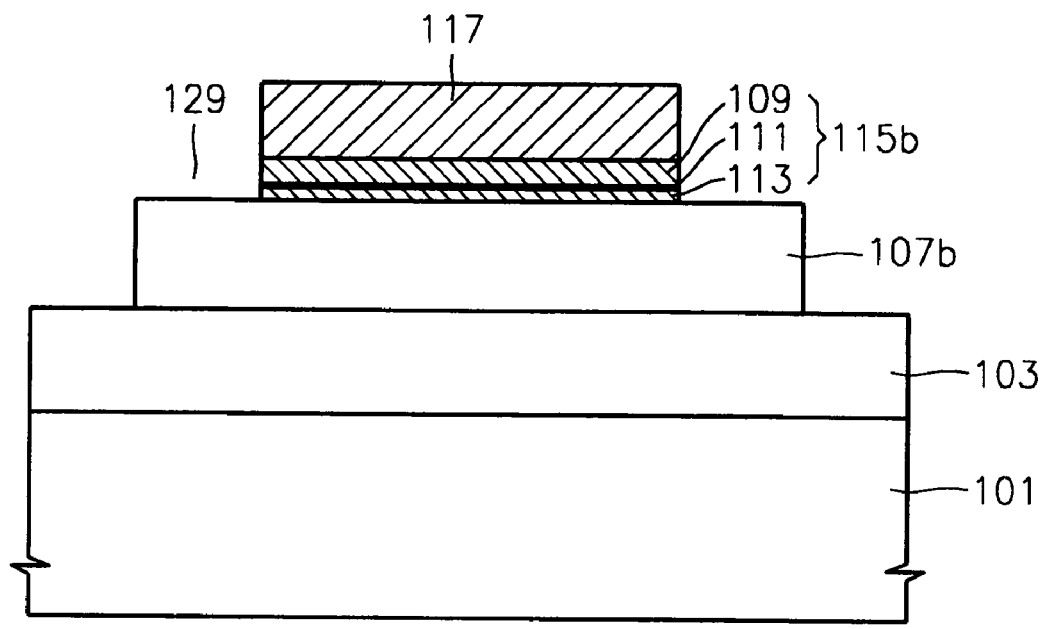
FIG. 4 is a cross-sectional view of the EPROM device taken along the line A-A' of the gate stack of FIGS. 1 and 2 according to a second embodiment of the present invention.

FIG. 4 is a cross-sectional view of the EPROM device taken along the line A-A' of the gate stack of FIGS. 1 and 2 according to a second embodiment of the present invention.

Specifically, in FIG. 4, the same reference numerals as in FIGS. 3A and 3B represent the same elements. In a second embodiment, the cross-sectional view of the EPROM device taken along the line B-B' of the floating transistor of FIGS. 1 and 2 is the same as in FIG. 3B of the first embodiment except that there is no reference numeral 115a shown in FIG. 3B. The second embodiment is the same as the first embodiment except that after forming the structure of FIG. 3A, the second nitride spacer 123b, the insulating pattern 115b and the first nitride spacer 123a disposed under the second nitride spacer 123b are etched by using the control gate 117 as an etch mask.

Figure 5:
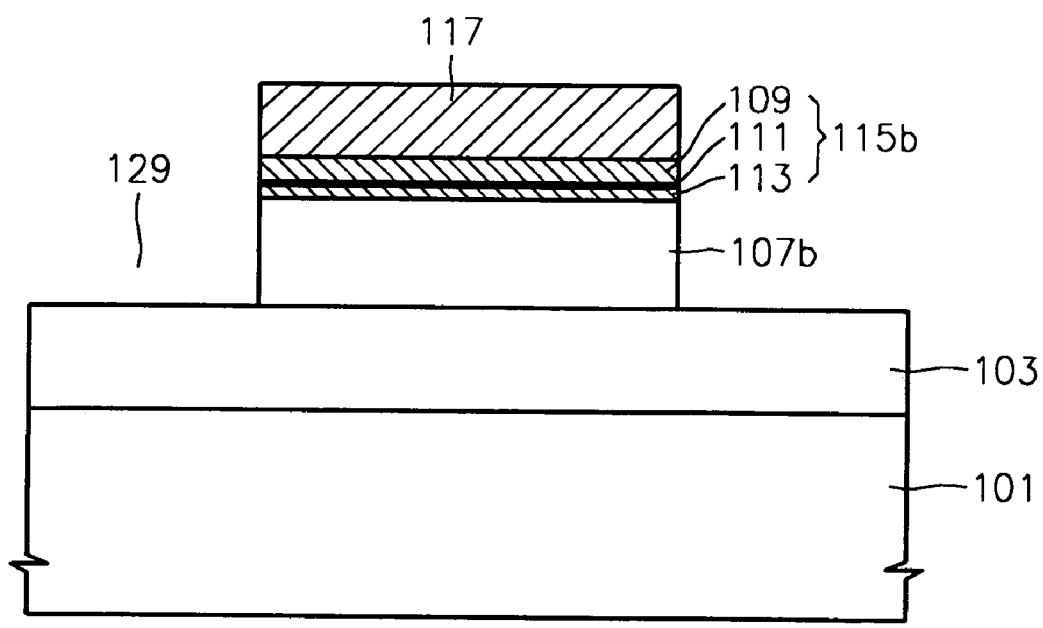
FIG. 5 is a cross-sectional view of the EPROM device taken along the line A-A' of the gate stack of FIGS. 1 and 2 according to a third embodiment of the present invention.

FIG. 5 is a cross-sectional view of the EPROM device taken along the line A-A' of the gate stack of FIGS. 1 and 2 according to a third embodiment of the present invention.

Specifically, in FIG. 5, the same reference numerals as in FIGS. 3A and 3B represent the same elements. In a third embodiment, the cross-sectional view of the EPROM device taken along the line B-B' of the floating transistor of FIGS. 1 and 2 is the same as in FIG. 3B of the first embodiment except that there is no reference numeral 115a shown in FIG. 3B. The third embodiment is the same as the second embodiment except that in FIG. 4, the width of the control gate 117 and the width of the insulating pattern 115 are equal to that of the first floating gate 107b. In the third embodiment shown in FIG. 5, ultraviolet rays can penetrate through the window 129 disposed on both sidewalls of the first floating gate 107b.

Figure 6:
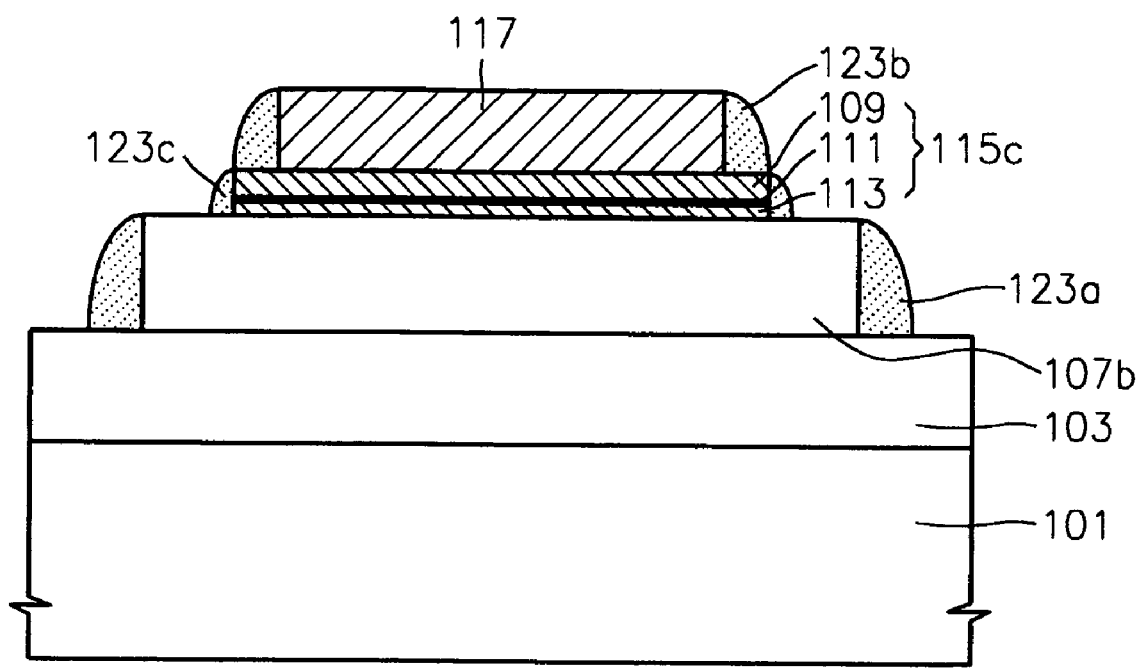
FIG. 6 is a cross-sectional view of the EPROM device taken along the line A-A' of the gate stack of FIGS. 1 and 2 according to a fourth embodiment of the present invention.

FIG. 6 is a cross-sectional view of the EPROM device taken along the line A-A' of the gate stack of FIGS. 1 and 2 according to a fourth embodiment of the present invention.

Specifically, in FIG. 6, the same reference numerals as in FIGS. 3A and 3B represent the same elements. In the fourth embodiment, the cross-sectional view of the EPROM device taken along the line B-B' of the floating transistor of FIGS. 1 and 2 is the same as in FIG. 3B of the first embodiment except that there is no reference numeral 115a shown in FIG. 3B. The fourth embodiment is the same as the first embodiment except that after forming the structure of FIG. 3A, a third nitride spacer 123c is formed on both sidewalls of the insulating pattern 115c. In the fourth embodiment, the window 129 is formed in a portion of the top surface of the first floating gate 107b, without using the control gate 117 as an etch mask.

FIGS. 7A through 11A and FIGS. 7B through 11B illustrate a method for fabricating the cell of the EPROM device as shown in FIGS. 3A and 3B.

Figure 7A:
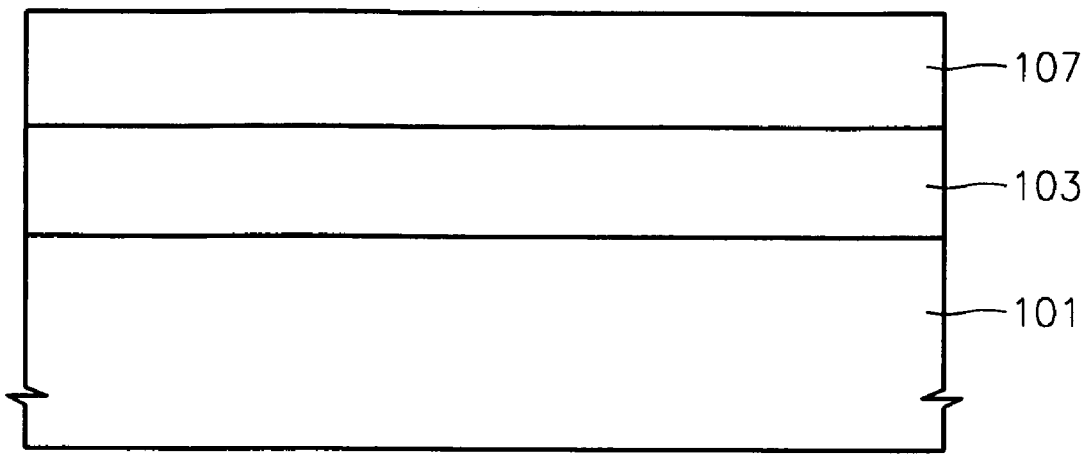
FIGS. 7A through 11B illustrate a method for fabricating the cell of the EPROM device as shown in FIGS. 3A and 3B.
Figure 7B:
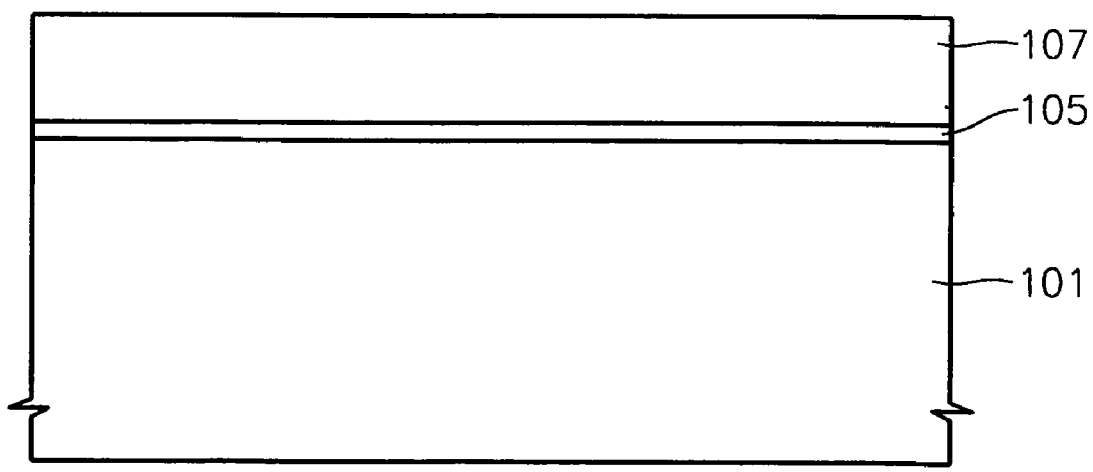

Referring to FIGS. 7A and 7B, a region of the gate stack (200 of FIGS. 1 and 2) and a region of the floating gate transistor (400 of FIGS. 1 and 2) are defined on the semiconductor substrate 101, for example, a silicon substrate. Next, the field insulating layer 103 is formed on the semiconductor substrate 101. A region where the field insulating layer 103 is formed becomes an isolation region, while a region where the field insulating layer 103 is not formed becomes an active region.

Afterwards, as shown in FIG. 7B, a gate insulating layer 105 is formed on the semiconductor substrate 101, where the floating gate transistor is formed. The gate insulating layer 105 is formed using an oxide layer to a thickness of 100 to 200 Å. Next, a conductive layer 107, which will be used as the first and second floating gates, is formed on the field insulating layer 103 of the gate stack and the gate insulating layer 105 of the floating gate transistor. The conductive layer 107 is formed of a polysilicon doped with impurity ions or a metal layer such as an aluminum layer. When the conductive layer 107 is formed of the polysilicon doped with impurity ions, it is formed to the thickness of 1000 to 2000 Å.

Figure 8A:
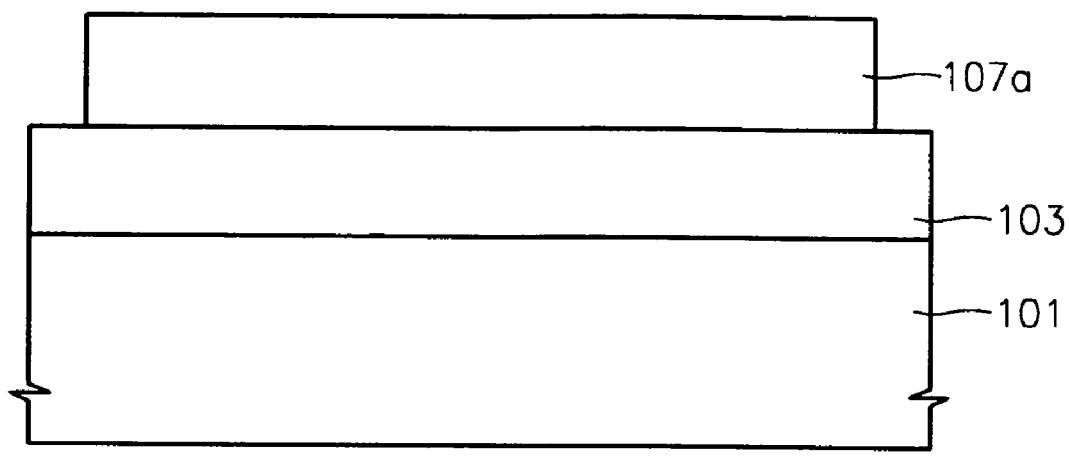
Figure 8B:
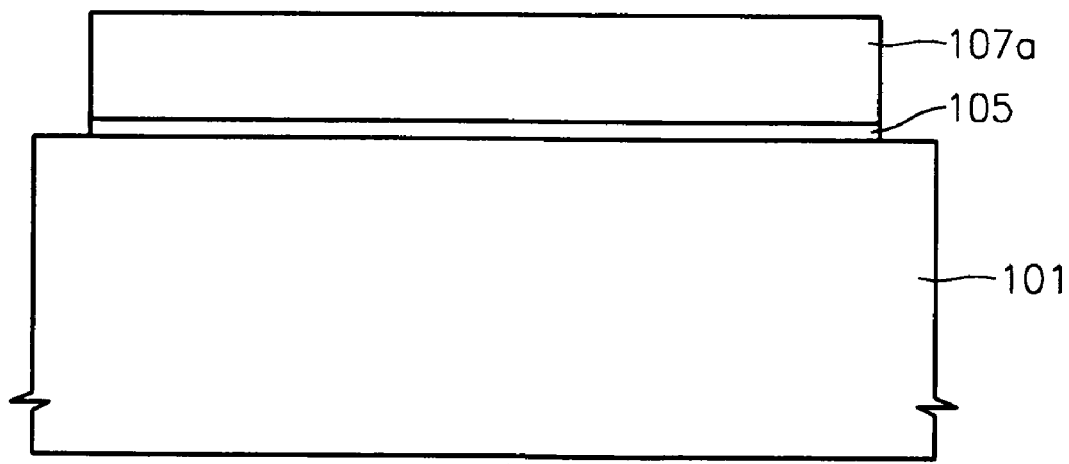

Referring to FIGS. 8A and 8B, the conductive layer 107 is patterned to form a conductive pattern 107a on the gate stack and the floating gate transistor. During the formation of the conductive pattern 107a, the gate insulating layer 105, formed under the conductive pattern 107a, is also etched. As a result, the gate insulating layer 105 is formed strictly under the conductive pattern 107a.

Figure 9A:
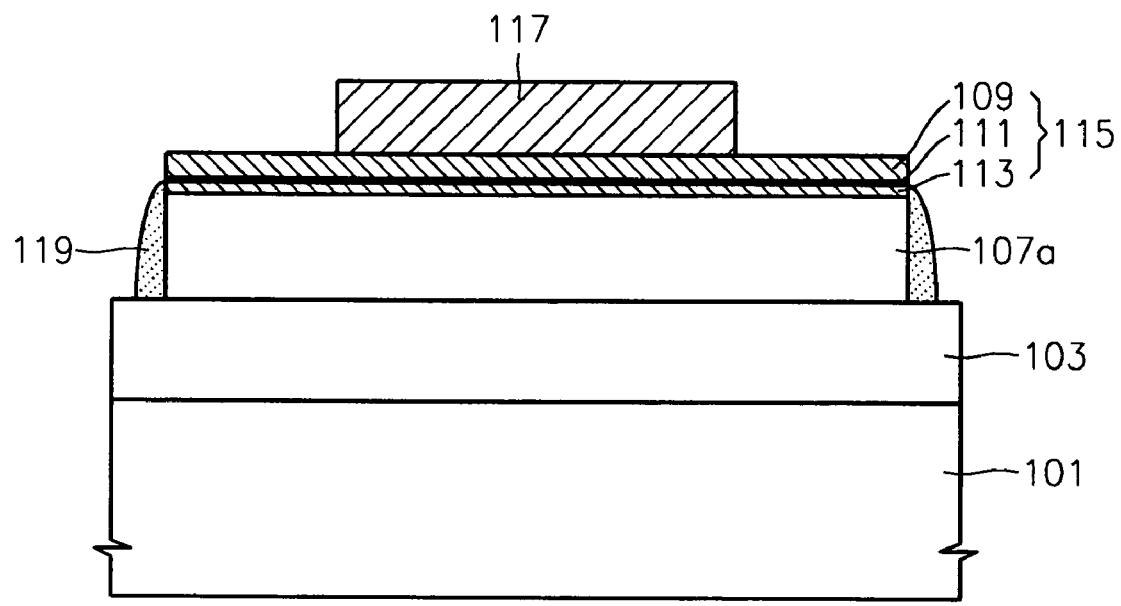
Figure 9B:
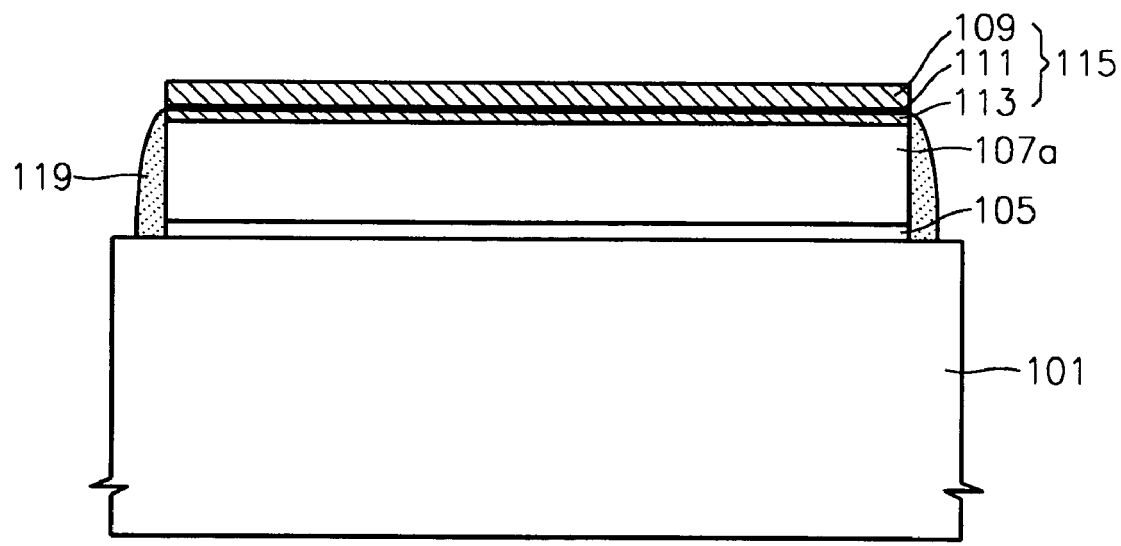

Referring to FIGS. 9A and 9B, a first insulating pattern 115 is formed on the conductive pattern 107a. The first insulating pattern 115 is formed of an oxide layer (109, O)-nitride layer (111, N)-oxide layer (113, O). To form the first insulating pattern 115, the oxide layer (109, O), the nitride layer (111, N), and the oxide layer (113, O) are formed to the thickness of 100 Å, 200 Å, and 100 Å, respectively, on the entire surface of the semiconductor substrate 101 where the conductive pattern 107a is formed, and are then patterned. The first insulating pattern 115 may be formed of only the nitride layer 111 and the oxide layer 113.

Next, the control gate 117 is formed on the first insulating pattern 115 of the gate stack. To form the control gate 117, a polysilicon layer doped with impurity ions or a metal layer such as an aluminum layer is formed on the entire surface of the semiconductor substrate where the first insulating pattern 115 is formed, and is then patterned. During the patterning process for forming the control gate 117, a polysilicon spacer 119 is formed on both sidewalls of the conductive pattern 107 of the gate stack and the floating gate transistor.

Figure 10A:
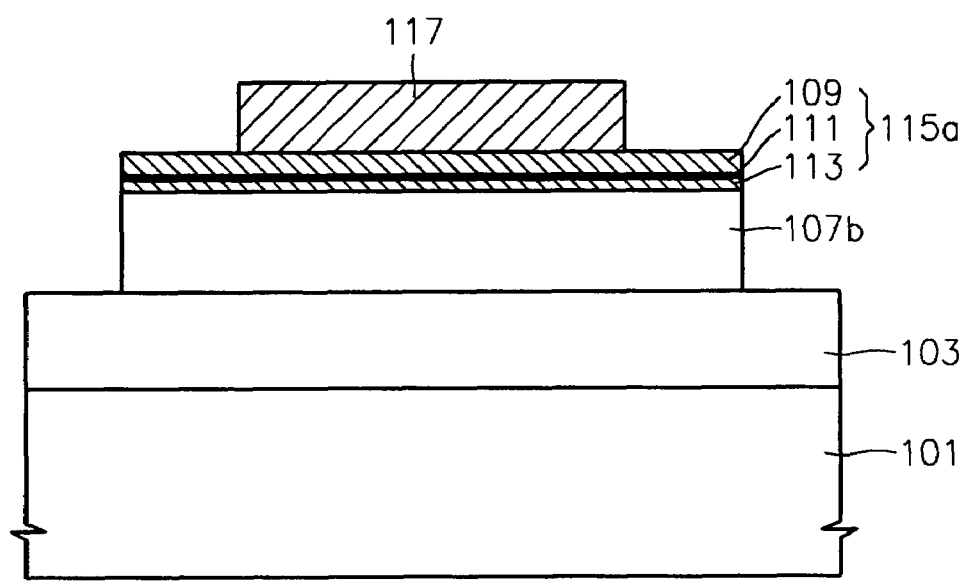
Figure 10B:
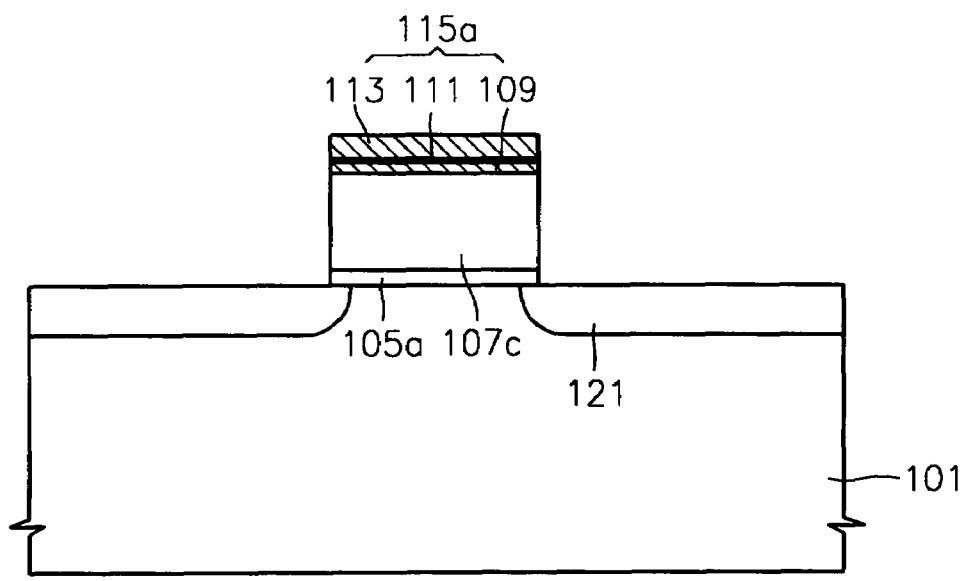

Referring to FIGS. 10A and 10B, the first insulating pattern 115, the conductive pattern 107a, and the gate insulating layer 105 of the gate stack and the floating gate transistor are patterned using photolithographic and etching processes. Thus, the first floating gate 107b and the second insulating pattern 115a are formed on the gate stack, while the gate insulating pattern 105, the second floating gate 107c, and the second insulating pattern 115a are formed on the floating gate transistor. Here, as shown in FIGS. 9A and 9B, the conductive spacer 119 is removed from both sidewalls of the conductive pattern 107a. Afterwards, as shown in FIG. 10B, impurity ions are implanted into the semiconductor substrate 101 so as to be aligned to both sidewalls of the second floating gate 107c, thereby forming a lightly doped source/drain 121.

Figure 11A:
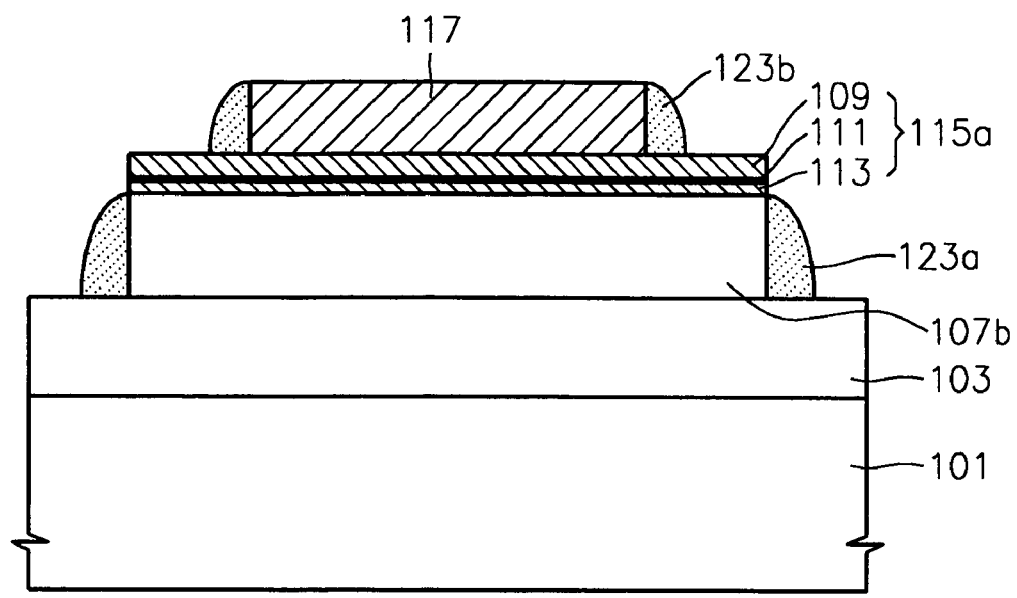
Figure 11B:
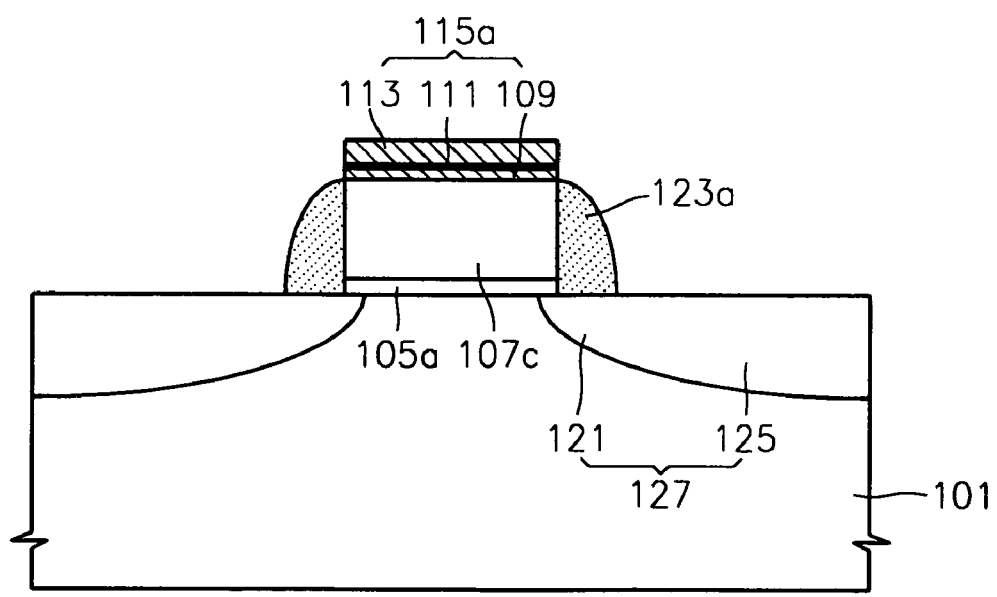

Referring to FIGS. 11A and 11B, a nitride layer is formed on the entire surface of the semiconductor substrate 101 where the control gate 117 and the second floating gate 107c are formed, and is then etched using an anisotropic etching process. Thus, the first nitride spacer 123a is formed on both sidewalls of the first floating gate 107b and the second floating gate 107c, and the second nitride spacer 123b is formed on both sidewalls of the control gate 117. Next, as shown in FIG. 11B, impurity ions are implanted into the semiconductor substrate 101 so as to be aligned to the nitride spacer 123a, thereby forming a heavily doped source/drain 125. As a result, the source/drain 127, which includes the lightly doped source/drain 121 and the heavily doped source/drain 125, is formed in the semiconductor substrate 101 of the floating gate transistor as shown in FIG. 11B.

As shown in FIG. 3A, the second insulating pattern 115a disposed on the first floating gate 107b is etched by using the control gate 117 and the second nitride spacer 123b as etch masks. Thus, the window 129 is formed on both sides of the control gate 117. In doing so, as described above, when ultraviolet rays are applied through the window 129 to the cell structure of the EPROM device, the programmed cell can be easily erased.

Further, the EPROM device shown in FIG. 4 is formed after forming the structure shown in FIG. 3A by covering the floating gate transistor with a photoresist pattern (not shown), and etching the second nitride spacer 123b, the second insulating pattern 115a disposed under the second nitride spacer 123b, and the first nitride spacer 123a.

To form the EPROM device of FIG. 5, while the first floating gate 107b and the second insulating pattern 115a are being formed in Step of FIG. 10A, the control gate 117 is formed to be the same width as that of the first floating gate 107b and the second insulating pattern 115a. Further, like the EPROM device of FIG. 4, the EPROM device of FIG. 5 is formed by etching the second nitride spacer 123b, the second insulating pattern 115a disposed under the second nitride spacer 123b, and the first nitride spacer 123a.

Alternatively, after forming the structure of FIG. 3A, the method of fabricating the EPROM device of FIG. 5 comprises covering the floating gate transistor with a photoresist pattern (not shown), and etching the second nitride spacer 123b, the second nitride pattern 115a disposed under the second nitride spacer 123b, the first floating gate 107b disposed under the control gate, and the first nitride spacer 123a.

Figure 12:
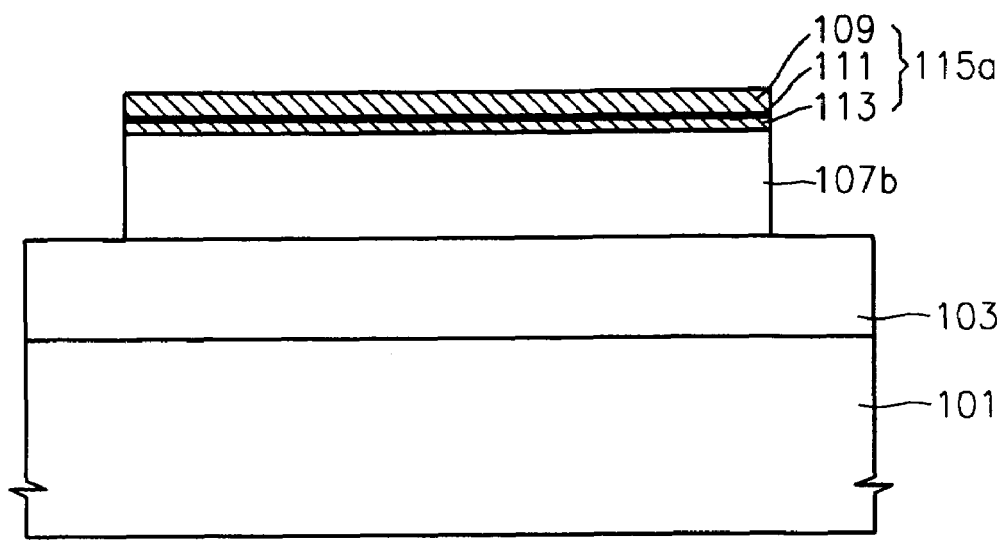
FIGS. 12 through 14 illustrate a method for fabricating the cell of the EPROM device as shown in FIG. 6.
Figure 13:
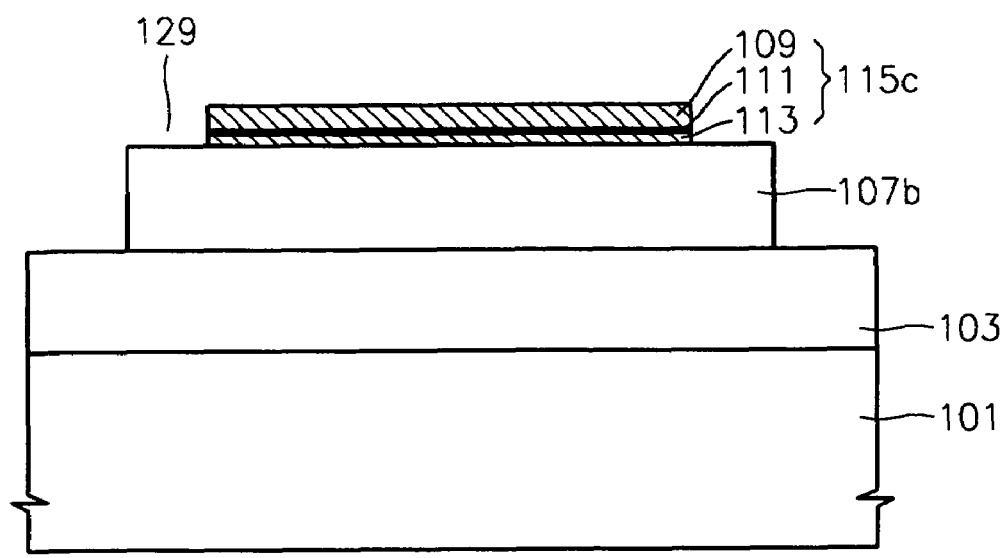
Figure 14:
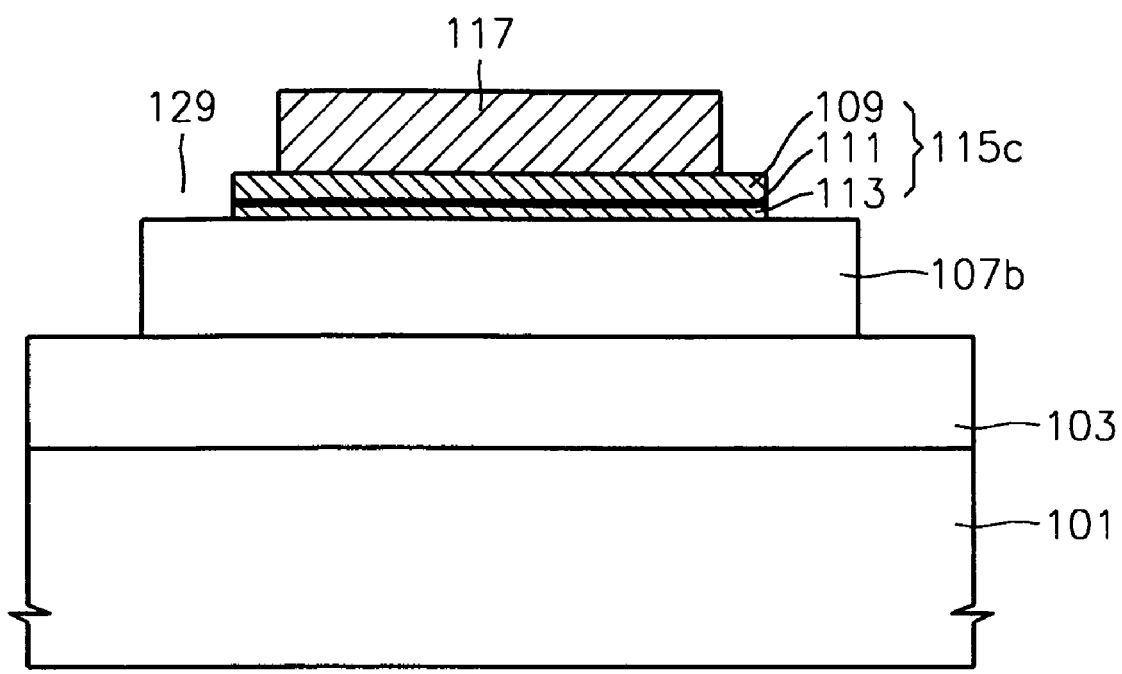

FIGS. 12A through 14 are cross-sectional views illustrating a method for fabricating the cell of the EPROM device as shown in FIG. 6. FIGS. 12 through 14 illustrate a method of fabricating the cell of the EPROM device of the gate stack, and a method of fabricating the floating gate transistor is the same as in FIGS. 7B through 11B. In FIGS. 12 through 14, the same reference numerals as in FIGS. 7A through 11A represent the same elements.

Referring to FIG. 12, as shown in FIGS. 8A through 10A, the first floating gate 107b and the second insulating pattern 115a are formed on the gate stack of the semiconductor substrate 101 where the field insulating layer 103 is formed.

Referring to FIG. 13, a portion of the second insulating pattern 115a formed on the first floating gate 107b is removed using photolithographic and etching processes, thereby forming the third insulating pattern 115c. Thus, the window 129 is formed on both sides of the third insulating pattern 115c. As described above, the window 129 serves as a path for ultraviolet rays.

Referring to FIG. 14, the control gate 117 is formed on the third insulating pattern 115c. Then, as shown in FIG. 6, a nitride layer is formed on the entire surface of the semiconductor substrate 101 and then etched using photolithographic and etching processes. Thus, the first nitride spacer 123a and the second nitride spacer 123b are formed on both sidewalls of the first floating gate 107b and the control gate 117, respectively. Further, the third nitride spacer 123c is formed on both sidewalls of the third insulating pattern 115c.

As set forth above, in the cell structure of the EPROM device according to the present invention, the window is formed on the top surface or both sidewalls of the first floating gate of the gate stack. Thus, ultraviolet rays can penetrate through the window and easily erase charges of the programmed cell.

In addition, in the cell structure of the EPROM device according to the present invention, the nitride spacer is formed on both sidewalls of the second floating gate of the floating gate transistor so as to prevent a short between the second floating gate and the source/drain. As a result, characteristics of the transistor can be improved.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method of fabricating a cell structure of an EPROM device comprising:
    defining a gate stack region and a floating gate transistor region on a semiconductor substrate;
    sequentially forming a first floating gate, an insulating pattern including a nitride layer, and a control gate in the gate stack region, and sequentially stacking a gate insulating layer, a second floating gate connected to the first floating gate, and an insulating pattern in the floating gate transistor region completely covering a top surface of the second floating gate such that both sidewalls of the insulating pattern are substantially aligned with both side walls of the second floating gate;
    forming a source/drain by implanting impurity ions into the semiconductor substrate so as to be aligned to both sidewalls of the second floating gate;
    forming nitride spacers on both sidewalls of the first floating gate, the control gate, and the second floating gate; and forming a window for exposing the top surface of the first floating gate by etching the insulating pattern formed on the first floating gate.

2. The method of claim 1, wherein when the window is formed, the insulating pattern is etched by using the control gate and the nitride spacers formed on both sidewalls of the control gate as etch masks.

3. The method of claim 1, wherein when the window is formed, the nitride spacer, and the insulating pattern on the side of the nitride spacer formed on both sidewalls of the control gate are etched using photolithographic and etching processes.

4. The method of claim 1, wherein when the window is formed, the nitride spacer, the insulating pattern on the side of the nitride spacer formed on both sidewalls of the control gate, and the first floating gate disposed under the control gate are etched using photolithographic and etching processes.

5. The method of claim 1, wherein the insulating pattern of the gate stack region is formed of one of an ONO layer and an NO layer.

6. The method of claim 1, wherein the control gate is formed to the width less than or equal to that of the first floating gate.

7. The method of claim 1, wherein the insulating pattern is formed to the width less than that of the first floating gate and more than that of the control gate.

8. The method of claim 1, wherein the insulating pattern is formed to be the same width as that of the first floating gate.

* * * * *